Feb. 27, 1968 M. F. AMSTERDAM ET AL 3,370,986

PHOTOVOLTAIC SERIES ARRAY COMPRISING P/N AND N/P CELLS

Filed Dec. 10, 1963

WITNESSES

Theodore F. Wrobel

Thomas J. Flynn

INVENTORS

Michael F. Amsterdam

Krishan S. Tarneja & Mohammed S. Shaikh

BY

C. L. Menzemer

ATTORNEY 3,370,986
PHOTOVOLTAIC SERIES ARRAY COMPRISING P/N AND N/P CELLS

Michael F. Amsterdam, Greensburg, Pa., Mohammed S. Shaikh, Mountain View, Calif., and Krishan S. Tarneja, Pittsburgh, Pa., assignors to Westinghouse Electric Corporation, East Pittsburgh, Pa., a corporation of Pennsylvania Filed Dec. 10, 1963, Ser. No. 329,423
3 Claims. (Cl. 136—89)

Figure 1:
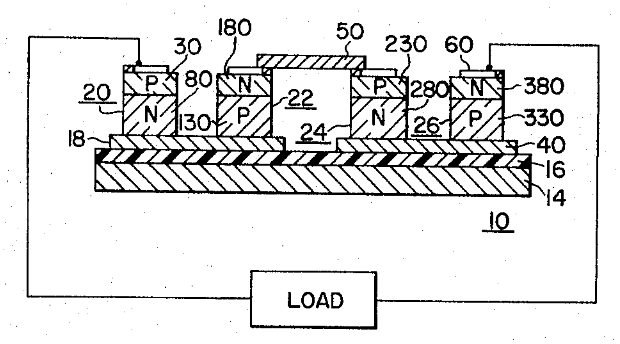

This invention relates generally to photovoltaic devices for the conversion of radiant energy into electrical energy and in particular to a large area array of two or more photovoltaic cells in series circuit relationship.

The invention is applicable to photovoltaic devices for conversion of solar radiation to electrical energy as well as to photovoltaic devices which are intended for conversion of radiation from sources other than the sun to electrical energy.

In setting forth the teachings of the present invention, the term:

"cell" referred to throughout the specification and claims is a strip of semiconductor material having a p-n or n-p junction;

"unit" is two or more cells connected electrically in series by an electrical conductor;

a p-n cell is a cell, as defined hereinabove, wherein the p-type region is a thin surface layer of p-type material on an n-type substrate; an n-p cell is a thin surface layer of n-type material on a p-type substrate;

"solar cell" means a photovoltaic device for any application and is not limited to those expressly designed for the conversion of solar energy into elecrical energy.

Conventional solar cells usually consist of a thin slice of semiconductor material in which a p-n junction is formed parallel to and near the surface of light incidence. Light absorbed in the slice of semiconductor material ionizes electron-hole pairs which diffuse at random until the minority charge carriers, electrons in p-type material, holes in n-type material, either recombine or reach the junction and contribute to the output current. In order to attain adequate electrical current for operating instruments, a relatively large radiation sensitive area is required.

Generally, the required large area is achieved by providing a large number of separate solar cells in a side-by-side relationship to form an overall array. Thus, with a large array of solar cells arranged in this manner, sufficient current is provided by connecting the cells electrically in series with each other.

In general, each cell is rectangular in shape and is soldered on one surface, usually the lower surface, to a conducting body to which one terminal connection is made. The oppositely opposed surface, usually the upper surface, of the cell constitutes the radiation sensitive surface and has suitable current collecting means to which the other terminal is connected.

A series electrical connection between a plurality of cells of the same type, has been effected in the past by providing a shingled structure wherein the bottom surface of one cell overlaps the top end surface of an adjacent cell. This type of arrangement provides relatively good electrical contact between adjacent cells and lessens the probability of causing a short circuit in the system. This shingling arrangement, since it involves an overlap of material decreases the usable cell surface area. In addition, the shingling arrangement, besides decreasing the effective cell surface area, does not allow the strength and simplicity that can be obtained in an arrangement made up of edged butted strips lying flat on a common substrate sheet.

In other instances where a large number of identical cells have been placed in coplanar relationship, individual connection circuits between the cells are required to provide desired series connections. Such multiple connections result in problems in assembling the array and also in the electrical insulation that is required for the connections.

An object of this invention is to provide a solar cell array with a large radiation sensitive area for the conversion of radiant energy into electrical energy.

Another object of the present invention is to provide a means of connecting a plurality of solar cell units electrically in series.

Another object of this invention is to provide a solar cell array in which each cell has one surface which is in total contact with an electrical conductor.

Other objects of the invention will, in part, be obvious and will, in part, appear hereinafter.

In accordance with the present invention and in attainment of the foregoing objects there is provided a photovoltaic array comprising a first photovoltaic cell comprising a semiconductive substrate of the first type semiconductivity and a semiconductive surface layer of the second type semiconductivity, a second photovoltaic cell comprising a semiconductive substrate of the second type semiconductivity and a surface layer of the first type semiconductivity with the substrates of the photovoltaic cells joined to an electrically conductive member so as to form an ohmic contact therewith.

Figure 2:
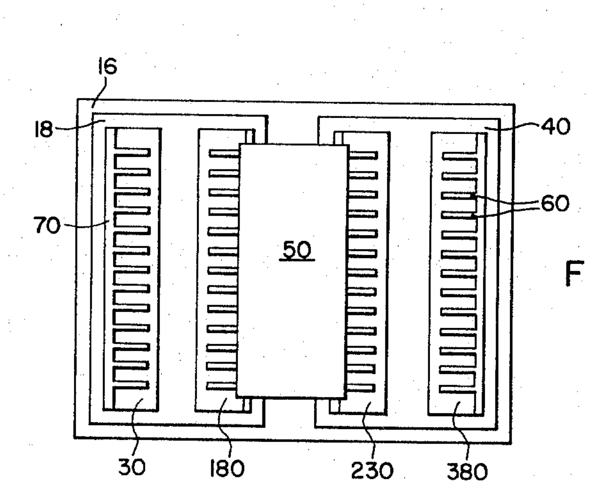

For a better understanding of the nature and objects of the invention, reference should be had to the following detailed descriptions and drawings, in which:

FIGURE 1 is a cross sectional view in elevation of a solar cell array produced in accordance with the teachings of this invention; and FIG. 2 is a plan view of a solar cell array produced in accordance with the teachings of this invention.

Referring to FIGURE 1, there is shown a solar cell array 10 prepared in accordance with the teachings of this invention. A lightweight thermally conductive metal sheet 14, for example, aluminum, is used as the base of the array. An electrically insulating layer 16 for example, an epoxy resin filled with a ceramic material for example aluminum oxide is coated onto the aluminum sheet 14 so as to completely cover it. An electrical conductor 18 for example, copper is affixed onto the ceramic filled epoxy layer 16 so as to form a good insulating mechanical bond between the conductor 18 and the aluminum base member 14.

A semiconductive silicon solar cell 20 having a p-type surface layer 30 and an n-type substrate 80 is soldered to the copper conductor 18, the connection being made between the substrate 80 and the conductor 18. A second semiconductive silicon solar cell 22 with an n-type surface 180 and a p-type substrate 130 is also connected to the copper conductor 18, the connection being made between the substrate 130 and the conductor 18.

A second copper conductor 40 is also affixed to the ceramic filled epoxy layer 16. A third semiconductive silicon solar cell 24 with a p-type surface 230 and an n-type substrate 280 is soldered to the electrical conductor 40. A fourth semiconductive silicon solar cell 26 with an n-type surface layer 380 and a p-type substrate 330 is soldered to the electrically conductive copper 40. A metallic strip 50, for example copper is soldered to the surface layer 180 of solar cell 22 and to the surface layer 230 of solar cell 24 so as to form an electrical series connection therewith.

The semiconductive silicon used as the solar cell material in the teachings of this invention may be silicon which is grown by various techniques for example float zone, chrochalski or the web portion of a webbed silicon dendrite prepared as described in copending U.S. patent application Ser. No. 98,618, now Patent No. 3,129,061, or any other process which is known to those skilled in the art.

Referring to FIGURE 2 there is shown a top plan view of an array produced in accordance with the teachings of this invention. Nickel leads 70 and thinner nickel strips 60 have been affixed to the surface layers of the solar cells in order to form ohmic contacts on the surfaces in a way so as to enable radiation to impinge thereon.

*Example*

An array measuring approximately 13 inches by 6.7 inches was prepared. The surface of the array comprised twelve solar cells, measuring approximately 30 cm. by 1 cm. by .05 cm.

Long ribbons of silicon produced by the dendritic growth process were used as the starting material. The long ribbons were cut into strips of 30 cm. Each strip was 1 cm. wide and .05 cm. thick. Six strips were n-type silicon and six were p-type silicon.

The six n-type silicon strips were cleaned and then a shallow p-type junction was formed in one surface by diffusing boron into the surface. The junction depth was of the order of one micron.

The six p-type strips were cleaned and then a shallow n-p junction was formed in one surface by diffusing phosphorus into the surface. The junction depth was of the order of one micron.

Fine grid pattern contacts were made on the shallow surface layer of all twelve strips by the photoresist technique. After the grid pattern was applied by the photoresist technique, the strips were nickel plated in an electroless nickel plating solution followed by dip soldering.

The base of the array was prepared as follows. A thin aluminum sheet approximately 13 inches x 6.7 inches x 0.44 inch was coated on one surface by an epoxy resin filled with $Al_2O_3$. Six copper strips measuring approximately 30 cm. x 2¼ cm. x .05 cm. were affixed to the epoxy ceramic filled layer.

The six copper strips are adjacent to one another and are separated from each other by a distance of approximately ⅛ inch.

The 12 silicon strips were then mounted. Two strips were mounted on each copper strip by a soft solder of tin-lead. The first silicon strip mounted onto each copper strip was an n-type silicon strip with a shallow p-type surface layer with nickel leads on the surface layer. The second silicon strip mounted on each copper strip was a p-type silicon strip with a shallow n-type surface layer with nickel leads being on the surface layer.

The p-type surface layer of each silicon strip was then connected electrically in series to the n-type surface layer of the adjacent silicon strip with a thin nickel plate 30 cm. long and .5 cm. wide.

The array described above weighed approximately .8 pound. The output power of the array was 1.8–2.0 watts when irradiated with a 500 watt tungsten lamp having an intensity of 140 mw./cm.$^2$.

While the invention has been described with reference to particular embodiments and examples, it will be understood, of course, that modifications, substitutions and the like may be made without departing from its scope.

We claim as our invention:

1. A photovoltaic array comprising: an insulating base member having a first regular surface; first and second spaced apart conductive portions integral with said insulating surface; first and third photovoltaic cells comprising a bulk material of a semiconductive substrate of a first type semiconductivity having a top surface and a bottom surface and a thin surface layer of a second type semiconductivity extending over the top surface of said bulk material to form a p-n junction therewith; said p-n junction being generally parallel to said insulating surface; said bottom surface of said substrate of said first and third cells being integral with said first and second conductive portions, respectively; second and fourth photovoltaic cells comprising a bulk material of a semiconductive substrate of the second type semiconductivity having a top surface and a bottom surface and a thin surface layer of the first type semiconductivity extending over the top surface of said bulk material to form an n-p junction therewith; said p-n junction being generally parallel to said insulating base surface; said substrate bottom surface of said second and fourth cells being integral with said first and second conductive portions, respectively; said p-n junction and n-p junctions being generally parallel to one another; and an electrically conductive strip; said strip being affixed to the said surface layers of said second and third photovoltaic cells thereby forming series electrical connections between the surface layers of said second and third photovoltaic cells.

2. The photovoltaic array of claim 1 wherein said bulk material of each of said photovoltaic cells comprises a thin webbed portion of a semiconductive webbed dendrite.

3. The photovoltaic array of claim 1 wherein said electrically conductive strips consist of conductive strips generally parallel with said insulating base surface.

References Cited

UNITED STATES PATENTS

| | | | |
|---|---|---|---|
| 2,402,662 | 6/1946 | Ohl | 136—89 |
| 2,779,811 | 1/1957 | Picciano et al. | 136—89 |
| 2,892,094 | 6/1959 | Lehovec | 250—211 |
| 2,911,539 | 11/1959 | Tanenbaum | 250—211 |
| 3,110,634 | 11/1963 | Bradshaw | 136—173 |
| 3,129,061 | 4/1964 | Dermatis et al. | 23—223.5 |
| 3,186,873 | 6/1965 | Dunlap | 136—89 |

OTHER REFERENCES

Lamond, P. et al., 15th Ann Power Sources Conf., October 1961, pp. 106–108.

Mandelkorn, Jr. et al., 14th Ann Power Sources Conf., October 1960, pp. 42–45.

ALLEN B. CURTIS, *Primary Examiner.*

A. M. BEKELMAN, *Assistant Examiner.*